(12) United States Patent
Song et al.

(10) Patent No.: US 9,257,407 B2
(45) Date of Patent: Feb. 9, 2016

(54) HETEROGENEOUS CHANNEL MATERIAL INTEGRATION INTO WAFER

(71) Applicant: QUALCOMM Incorporated, San Diego, CA (US)

(72) Inventors: Stanley Seungchul Song, San Diego, CA (US); Choh Fei Yeap, San Diego, CA (US); Zhongze Wang, San Diego, CA (US); Niladri Narayan Mojumder, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 107 days.

(21) Appl. No.: 14/064,944

(22) Filed: Oct. 28, 2013

(65) Prior Publication Data

US 2015/0115473 A1    Apr. 30, 2015

(51) Int. Cl.
| | |
|---|---|
| *H01L 27/092* | (2006.01) |
| *H01L 23/00* | (2006.01) |
| *H01L 23/528* | (2006.01) |
| *H01L 29/267* | (2006.01) |
| *H01L 21/822* | (2006.01) |
| *H01L 21/8258* | (2006.01) |
| *H01L 27/06* | (2006.01) |
| *H01L 21/762* | (2006.01) |

(52) U.S. Cl.
CPC ............ *H01L 24/29* (2013.01); *H01L 21/8221* (2013.01); *H01L 21/8258* (2013.01); *H01L 23/528* (2013.01); *H01L 24/83* (2013.01); *H01L 27/0605* (2013.01); *H01L 27/0688* (2013.01); *H01L 27/092* (2013.01); *H01L 27/0922* (2013.01); *H01L 29/267* (2013.01); *H01L 21/76251* (2013.01); *H01L 2224/83948* (2013.01); *H01L 2924/12042* (2013.01)

(58) Field of Classification Search
CPC .............................................. H01L 2224/83948
See application file for complete search history.

(56) References Cited

U.S. PATENT DOCUMENTS

| | | | |
|---|---|---|---|
| 5,606,186 | A | 2/1997 | Noda |
| 6,455,398 | B1 | 9/2002 | Fonstad, Jr. et al. |
| 7,875,952 | B1 | 1/2011 | Elliott et al. |
| 8,258,610 | B2 | 9/2012 | Cho et al. |

(Continued)

FOREIGN PATENT DOCUMENTS

| | | |
|---|---|---|
| EP | 1104028 A2 | 5/2001 |
| EP | 2521168 A1 | 11/2012 |
| FR | 2933232 A1 | 1/2010 |
| JP | 2009158528 A | 7/2009 |
| WO | 2012169213 A1 | 12/2012 |

OTHER PUBLICATIONS

International Search Report and Written Opinion—PCT/US2014/053897—ISA/EPO—Dec. 15, 2014.

*Primary Examiner* — Stephen W Smoot
(74) *Attorney, Agent, or Firm* — Seyfarth Shaw LLP

(57) ABSTRACT

Methods for integrating heterogeneous channel material into a semiconductor device, and semiconductor devices that integrate heterogeneous channel material. A method for fabricating a semiconductor device includes processing a first substrate of a first material at a first thermal budget to fabricate a p-type device. The method further includes coupling a second substrate of a second material to the first substrate. The method also includes processing the second substrate to fabricate an n-type device at a second thermal budget that is less than the first thermal budget. The p-type device and the n-type device may cooperate to form a complementary device.

9 Claims, 6 Drawing Sheets

(56) References Cited

U.S. PATENT DOCUMENTS

2004/0145399 A1 * 7/2004 Bhattacharyya .............. 327/278
2011/0298021 A1   12/2011 Tada et al.
2013/0082235 A1   4/2013 Gu et al.
2014/0091392 A1   4/2014 Takada et al.

* cited by examiner

HETEROGENEOUS CHANNEL MATERIAL INTEGRATION INTO WAFER

BACKGROUND

1. Field

Aspects of the present disclosure relate to semiconductor devices, and more particularly to heterogeneous channel material integration for materials that have different thermal budgets.

2. Background

Semiconductor chip level bonded devices are used in several consumer and commercial applications. Semiconductor devices are often made from a single type of material. Semiconductor devices may also be made of different types of material grown onto a substrate based on lattice matching and compatible crystalline structures. Semiconductor devices manufactured from compound materials (i.e., where the semiconductor structure is more than one material), such as III-V materials, are typically grown on gallium arsenide or other compound semiconductor substrates. These devices are difficult to integrate with electronic devices fabricated on silicon because of lattice mismatches between the crystalline structures of silicon and compound semiconductor materials.

SUMMARY

A method for fabricating a device in accordance with one aspect of the present disclosure includes processing a first substrate of a first material at a first thermal budget to fabricate a p-type device. Such a method further includes coupling a second substrate of a second material to the first substrate. The method also includes processing the second substrate to fabricate an n-type device at a second thermal budget that is less than the first thermal budget. The p-type device and the n-type device may cooperate to form a complementary device.

A semiconductor device in accordance with another aspect of the present disclosure includes a first substrate of a first material having a first thermal budget. The first substrate may include a p-type device. Such a device also includes a second substrate of a second material having a second thermal budget that is coupled to the first substrate. The second substrate may include an n-type device. The p-type device and the n-type device may cooperate to form a complementary device.

Another semiconductor device in accordance with one aspect of the present disclosure includes a first means for conducting a first charge carrier type in a first substrate of a first material having a first thermal budget. Such a device also includes a second means for conducting a second charge carrier type in a second substrate. The second substrate may be of a second material having a second thermal budget and coupled to the first substrate. The first means and the second means may cooperate to form a complementary device.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

A high mobility conduction channel is desirable for high performance transistors. Such transistors are often made using III-V materials. The narrow energy bandgap of III-V materials, however, may not provide leakage current below 1 nA/μm. For low-power devices, silicon channels are desired because silicon channels can prevent low leakage currents, however, these devices may have lower performance than III-V devices.

Heterogeneous channel integration of a III-V channel into a semiconductor wafer, (e.g., silicon), or integration of III-V devices with other semiconductor material systems into the same wafer is difficult. Complicated epitaxial growth processes due to dissimilar materials, and thermal and mechanical stresses, complicate heterogeneous material integration. Integrating a separate semiconductor material system with III-V devices into a single wafer is even more difficult due to the thermal budget of some material systems (e.g., silicon >1000 C) and the thermal budget limitation of III-V materials (<700 C).

An aspect of the present disclosure processes different semiconductor material systems, (e.g., Si and III-V) devices in different levels or "tiers." One aspect of the present disclosure allows for silicon processing and III-V processing within the same circuit without affecting prior structural process steps.

Figure 1:
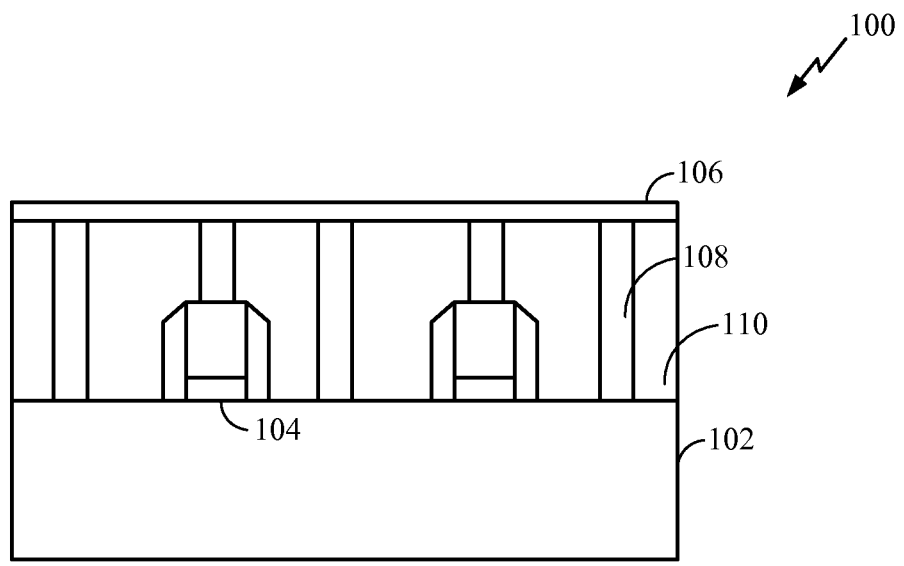
FIG. 1 illustrates a side view of a semiconductor device in an aspect of the present disclosure.

FIG. 1 illustrates a side view of a semiconductor device in an aspect of the present disclosure. A wafer 100 comprises a first substrate 102, a semiconductor device 104, an interface layer 106, and an interconnect 108. The wafer 100 may comprise many integrated circuits, which are produced by dicing, cleaving, or cutting the wafer 100 into pieces. As such, FIG. 1 may illustrate the wafer 100 or a semiconductor chip that is a portion of the wafer 100.

One aspect of the present disclosure uses a semiconductor (e.g., silicon (Si)) substrate as the first substrate 102. Further, the semiconductor device 104, which may be formed on (or in) the first substrate 102, may be a metal-oxide-semiconductor field-effect transistor (MOSFET). The semiconductor device 104 may also be a tunneling field-effect transistor (TFET). The wafer 100 is processed to create the semiconductor device 104 and to create the interconnect 108. The first substrate 102 is processed until the semiconductor device 104 and interconnects have reached a certain point in the processing. That point may be at any desired time, but may be up to the local interconnection layer (e.g., middle of line (MOL)) or the first conductive layer (e.g., metal one (M1)).

The interface layer 106 is then coupled to an insulator layer 110 of the first substrate 102. The interface layer 106 may be an amorphous layer, such as silicon dioxide (SiO2), a crystalline layer, or any other layer or material that aids in the bonding or coupling of another material to the wafer 100 and also provides electrical isolation of the devices on substrate 102 from the subsequently processed devices.

Figure 2:
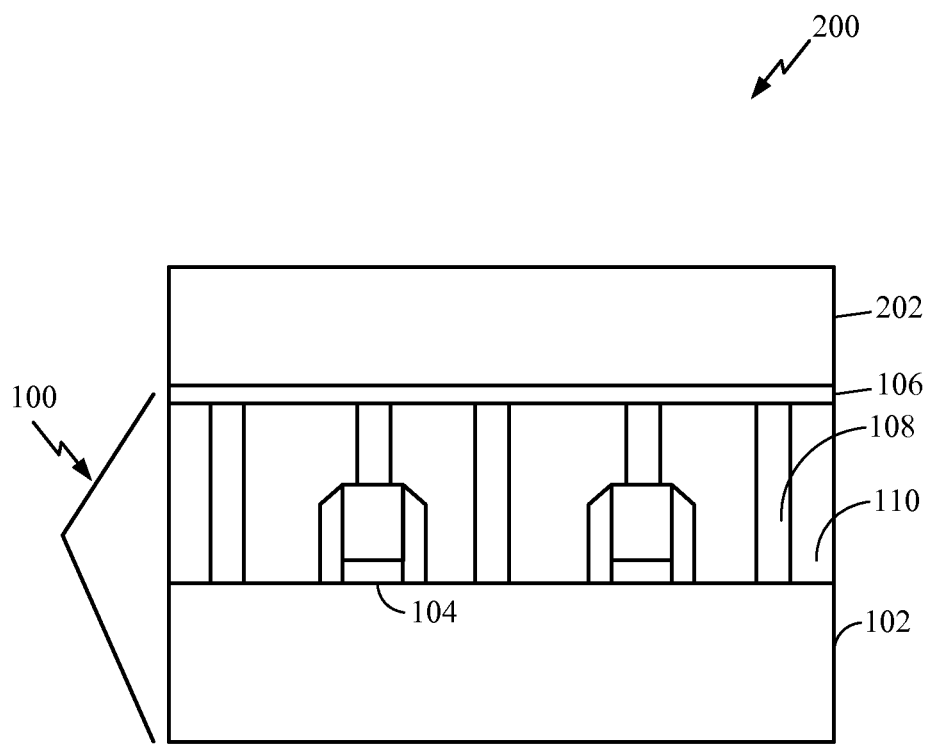
FIG. 2 illustrates coupling a compound semiconductor substrate to a different material system semiconductor device in an aspect of the present disclosure.

FIG. 2 illustrates coupling of a compound semiconductor substrate to a semiconductor (e.g., silicon) device in an aspect of the present disclosure. A coupled structure 200 shows that a second substrate 202 is coupled to the interface layer 106 of the wafer 100. The coupling of the second substrate 202 may be a bonding or "smart cut" process to couple the second substrate 202 to the wafer 100. The coupling may also be an oxide-oxide process. The coupling of the second substrate 202 may also be performed using annealing, plasma welding, or other forms of coupling the second substrate 202 to the wafer 100.

The second substrate 202 may be a III-V material, a II-VI material, or another material that has a different thermal budget than the first substrate 102. For example, and not by way of limitation, the first substrate 102 may be a silicon substrate that has a thermal budget of greater than 1000 degrees Centigrade. The second substrate 202 may be a III-V substrate (e.g., a gallium arsenide (GaAs) substrate) that has a thermal budget of less than 700 degrees Centigrade. This reduced thermal budget is specified because the crystalline bonds and/or covalent bonding of the compound III-V materials break down at the higher temperatures used for semiconductor processing.

The difference in thermal budget between the first substrate 102 and the second substrate 202 may be great enough to allow for processing of the second substrate 202 without substantial effect on the prior processing performed on the first substrate 102. The second substrate 202 may be coupled directly to the interface layer 106, or may be coupled to another layer of the first substrate 102. Further, additional steps (e.g., thinning the second substrate 202), may be performed prior to or after coupling the second substrate to the wafer 100.

Figure 3:
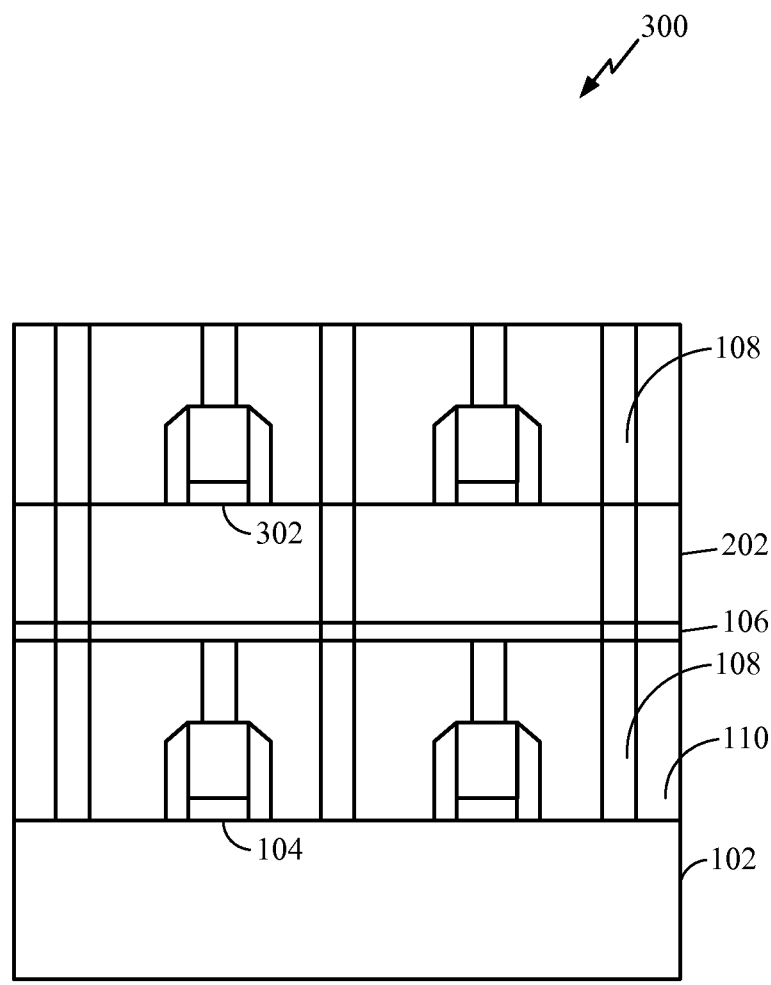
FIG. 3 illustrates a side view of a compound semiconductor device formed on the different material system semiconductor device in an aspect of the present disclosure.

FIG. 3 illustrates a side view of a compound semiconductor device 300 formed on a semiconductor device in an aspect of the present disclosure. The compound semiconductor device 300 includes a semiconductor device 302 formed on (or in) the second substrate 202. The second substrate 202 may be further processed to extend the interconnect 108 through the second substrate 202 and through additional processing layers coupled to the second substrate 202. In the case of III-V processing, which is performed at less than 700 degrees Centigrade, the semiconductor device 104, which may be a MOSFET, is substantially unchanged in electrical performance after forming the semiconductor device 302.

In an aspect of the present disclosure, the semiconductor device 302 may also be a MOSFET and/or a TFET device. In this configuration, the semiconductor device 104 and the semiconductor device 302 use different charge carriers in their respective channels. The semiconductor device 104 and the semiconductor device 302 may then be combined to create a complementary metal-oxide-semiconductor (CMOS) device.

A high mobility conduction channel is desirable for high performance transistors. Depending on a dopant density of the semiconductor device 104 when fabricated in silicon, electron mobility varies between 90 and 1500 $cm^2$/V-s, and hole mobility varies between 50 and 450 $cm^2$/V-s. In III-V materials, such as gallium arsenide, electron mobility is ~8500 $cm^2$/V-s, and hole mobility is relatively constant at ~400 $cm^2$/V-s.

A complementary device, in accordance with one aspect of the present disclosure, may use a p-type carrier in the semiconductor device 104 and an n-type device in the semiconductor device 302 to provide increased carrier mobility. Further, because the processing of the semiconductor device 302 can be tailored for single charge carrier devices, the narrow energy bandgap of III-V materials used in the second substrate 202 may be designed to assist in containing leakage current for values below 1 nA/μm. Alternatively, the semiconductor device 302 may be used in applications where leakage current would not degrade the overall circuit function. The use of the second substrate 202 may increase the performance of the compound semiconductor device 300 over a similar circuit made only from a single substrate material.

For example, and not by way of limitation, the semiconductor device 104 may be a p-type device (a PMOS device), and the semiconductor device 302 may be an n-type device (an NMOS device). The semiconductor device 104 and the semiconductor device 302 may then be coupled together to create a complementary device (CMOS). The processing of the semiconductor device 104, and/or the selection of the material used for the first substrate 102, may then be improved or even optimized for a specific charge carrier in the channel in the semiconductor device 104. Similarly, the processing of the semiconductor device 302, and/or the selection of the material for the second substrate 202 may then be improved or even optimized for a specific charge carrier in the channel in the semiconductor device 302. The present disclosure allows for tailoring of the channel characteristics through the use of the first substrate 102 and the second substrate 202. Further, the present disclosure allows for selection of the channel charge carriers and device performance and maintains the performance of the semiconductor device 104 while processing the semiconductor device 302.

In the case of III-V materials, the III-V process to create the semiconductor device 302 uses temperatures that have a negligible influence on the processing steps used to create the semiconductor device 104. Thus, creating the semiconductor device 302 has a negligible impact on the semiconductor device 104.

The semiconductor device 104 may also be assigned to a particular use, while the semiconductor device 302 may be assigned to a different use, within an aspect of the present disclosure. For example, the semiconductor device 104 may be used for a low power portion of an overall circuit where the compound semiconductor device 300 is employed, such as a modem. The semiconductor device 302, in such an aspect of the present disclosure, may be used as a high performance portion of the circuit such as a central processing unit (CPU).

Figure 4:
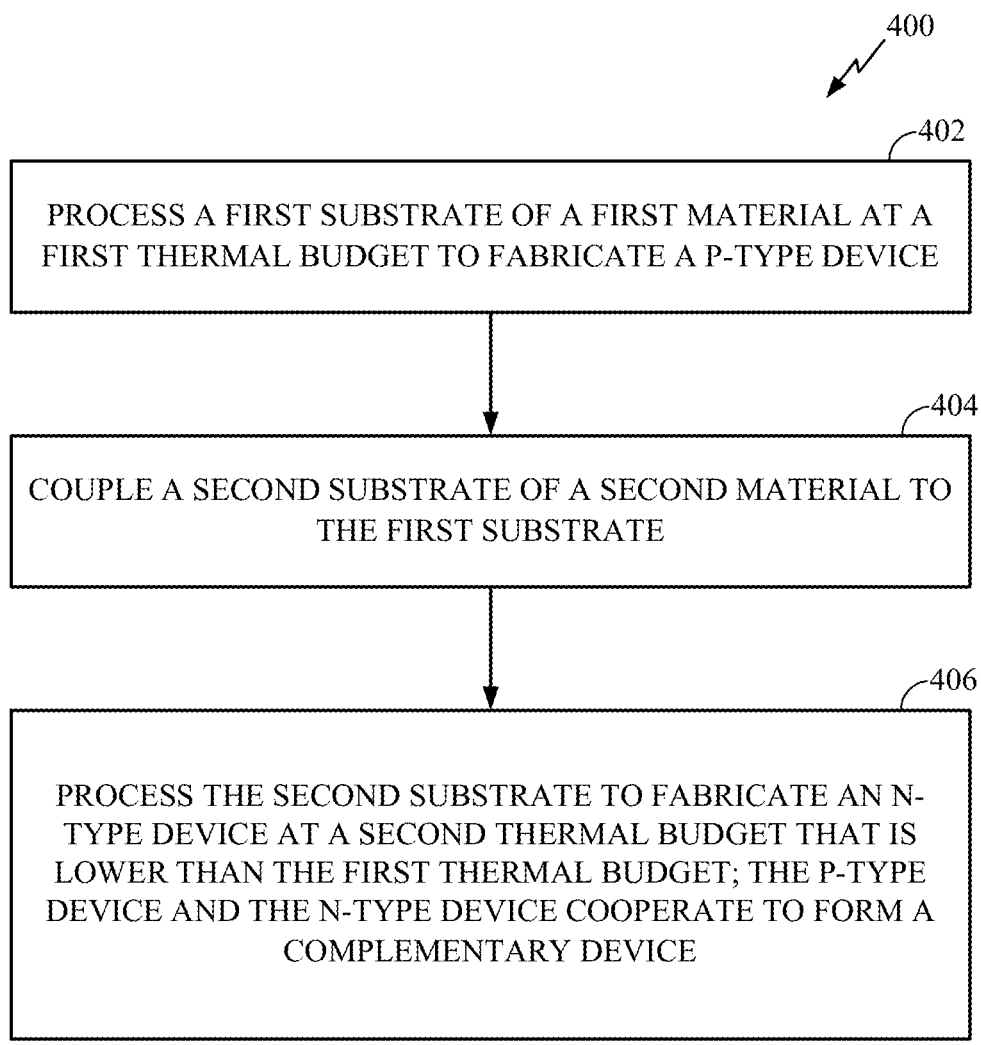
FIG. 4 is a process flow diagram illustrating a method of making a resonator according to an aspect of the present disclosure.

FIG. 4 is a process flow diagram illustrating a method 400 of making an integrated device according to an aspect of the present disclosure. At block 402, a first substrate of a first material is processed at a first thermal budget to fabricate a p-type device. At block 404, a second substrate of a second material is coupled to the first substrate. At block 406, the second substrate is processed to fabricate an n-type device at a second thermal budget that is lower than the first thermal budget. In one configuration, the p-type device and the n-type device cooperate to form a complementary device. For example, the semiconductor device 104 may be a p-type device (a PMOS device), and the semiconductor device 302 may be an n-type device (an NMOS device). The semiconductor device 104 and the semiconductor device 302 may then be coupled together to create a complementary device (CMOS), as shown in FIG. 3.

A compound device, in accordance with an aspect of the present disclosure, includes a first means for conducting a first charge carrier type in a first substrate of a first material having a first thermal budget. In one aspect of the disclosure, the first means may be the semiconductor device 104 and/or other structures configured to perform the functions recited by the first means. The compound semiconductor device also includes a second means for conducting a second charge carrier type in a second substrate of a second material having a second thermal budget coupled to the first substrate. The first means and the second means may cooperate to form a complementary device. In one aspect of the present disclosure, the second means may be the semiconductor device 302, and/or other structures configured to perform the functions recited by the second means. In another aspect, the aforementioned means may be any module or any apparatus configured to perform the functions recited by the aforementioned means.

Figure 5:
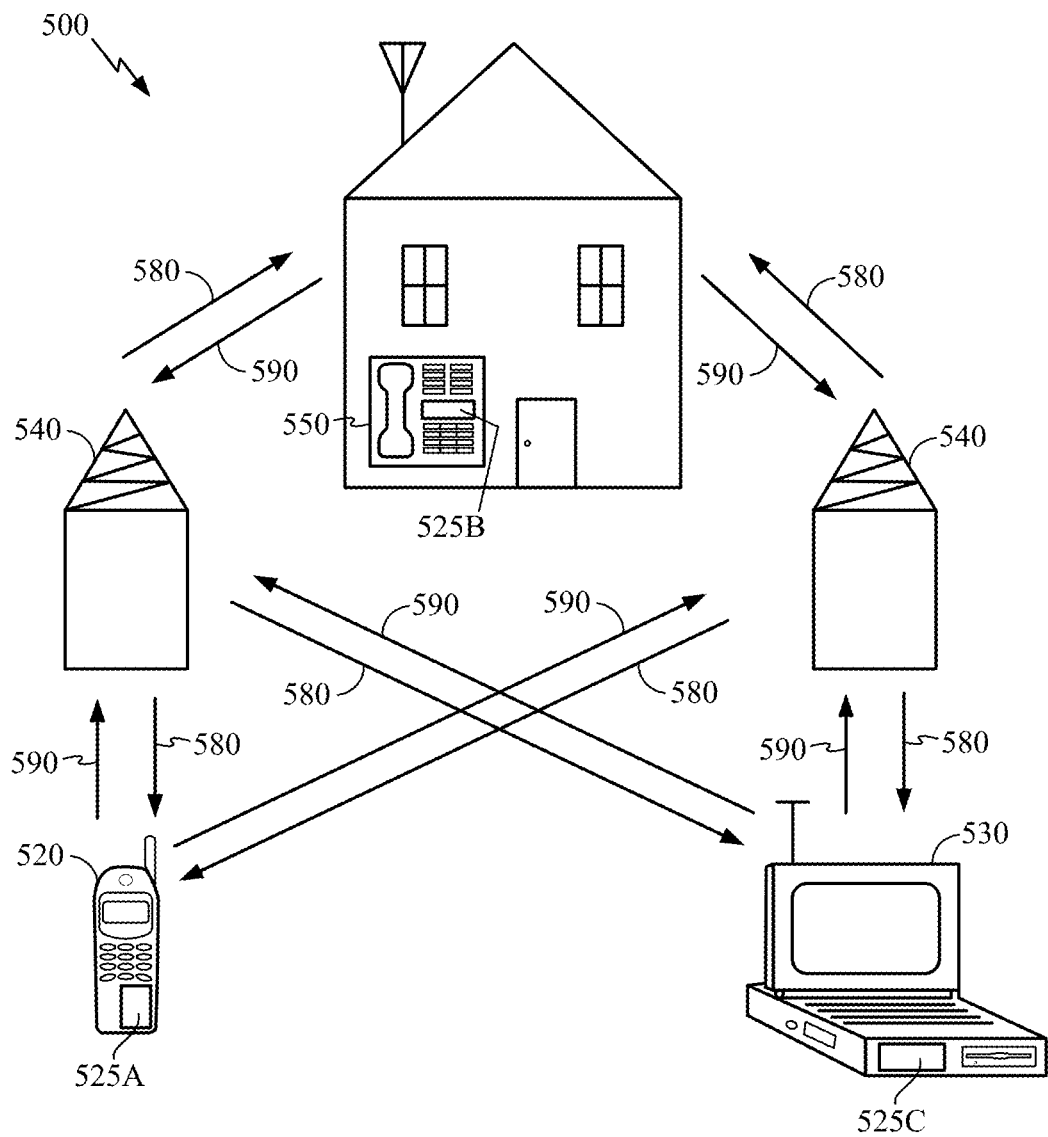
FIG. 5 is a block diagram showing an exemplary wireless communication system in which a configuration of the disclosure may be advantageously employed.
Figure 6:
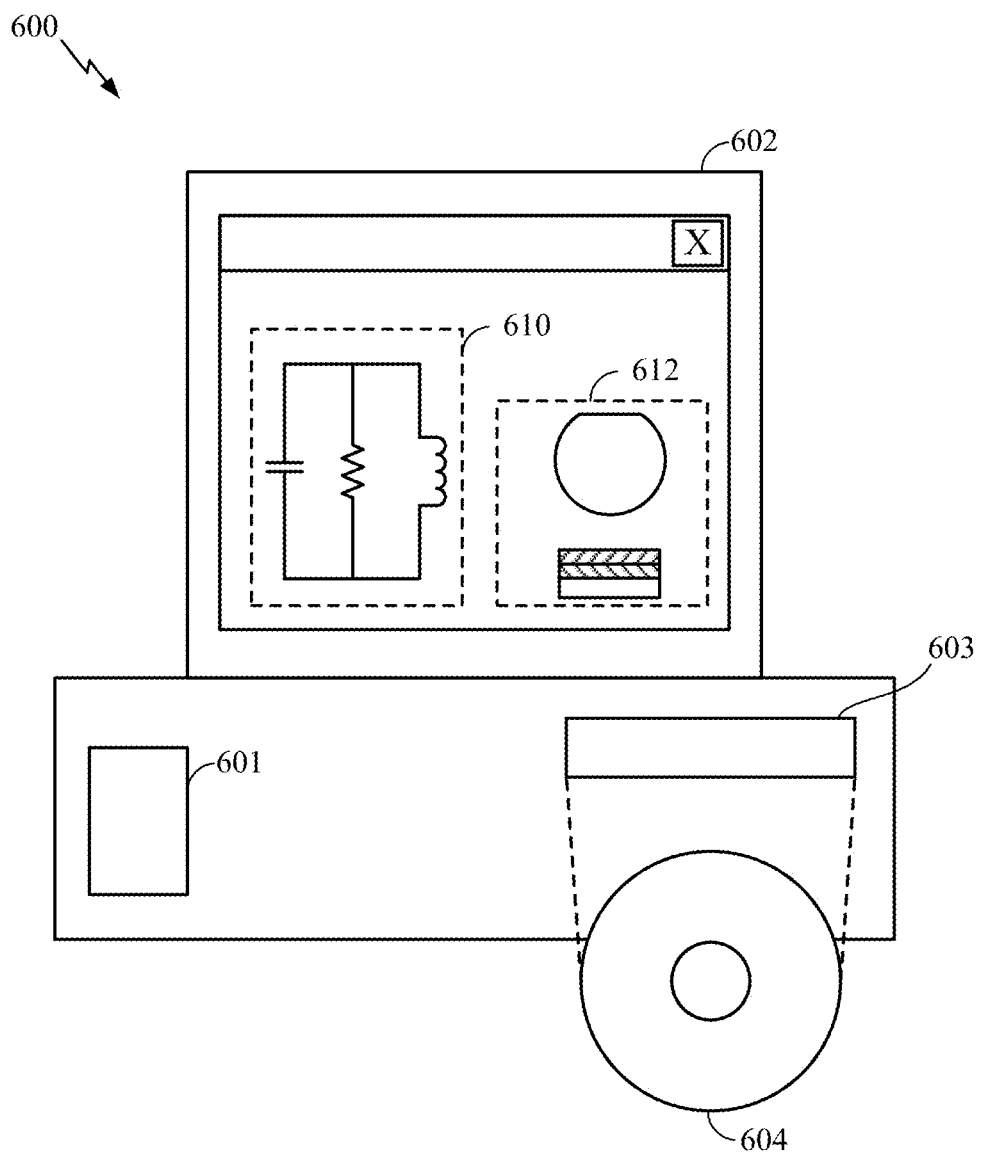
FIG. 6 is a block diagram illustrating a design workstation used for circuit, layout, and logic design of a semiconductor component according to one configuration.

FIG. 5 is a block diagram showing an exemplary wireless communication system 500 in which an aspect of the disclosure may be advantageously employed. For purposes of illustration, FIG. 6 shows three remote units 520, 530, and 550 and two base stations 540. It will be recognized that wireless communication systems may have many more remote units and base stations. Remote units 520, 530, and 550 include IC devices 525A, 525C, and 525B that include the disclosed devices. It will be recognized that other devices may also include the disclosed heterogeneous channel materials, such as the base stations, switching devices, and network equipment. FIG. 5 shows forward link signals 580 from the two base stations 540 to the remote units 520, 530, and 550 and reverse link signals 590 from the remote units 520, 530, and 550 to the two base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 5 illustrates remote units according to the aspects of the disclosure, the disclosure is not limited to these exemplary illustrated units. Aspects of the disclosure may be suitably employed in many devices, which include the disclosed devices.

FIG. 6 is a block diagram illustrating a design workstation used for circuit, layout, and logic design of a semiconductor component, such as the devices disclosed above. A design workstation 600 includes a hard disk 601 containing operating system software, support files, and design software such as Cadence or OrCAD. The design workstation 600 also includes a display 602 to facilitate design of a circuit 610 or a semiconductor component 612 such as a device having heterogeneous channel materials. A storage medium 604 is provided for tangibly storing the design of the circuit 610 or the semiconductor component 612. The design of the circuit 610 or the semiconductor component 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit 610 or the semiconductor component 612 by decreasing the number of processes for designing semiconductor wafers.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A semiconductor device, comprising:
   a first substrate of a first material having a first thermal budget, the first substrate comprising a p-type device surrounded by an insulator layer on the first substrate;
   an interface layer on the insulator layer of the first substrate arranged to electrically isolate the p-type device from subsequently processed devices;
   a second substrate of a second material having a second thermal budget directly coupled to the interface layer on the first substrate, the second substrate comprising an n-type device; and
   an interconnect electrically coupling the p-type device of the first substrate and the n-type device of the second substrate through the insulator layer, in which the p-type device and the n-type device cooperate to form a complementary device.

2. The semiconductor device of claim 1, in which the first substrate is a silicon substrate and the second substrate is a III-V substrate.

3. The semiconductor device of claim 1, in which the first thermal budget is greater than 1000 degrees centigrade and the second thermal budget is less than 700 degrees centigrade.

4. The semiconductor device of claim 1, integrated into a mobile phone, a set top box, a music player, a video player, an entertainment unit, a navigation device, a computer, a hand-held personal communication systems (PCS) unit, a portable data unit, and/or a fixed location data unit.

5. A semiconductor device, comprising:
   first means for conducting a first charge carrier type in a first substrate of a first material having a first thermal budget and surrounded by an insulator layer on the first substrate;
   means for electrically isolating the first conducting means from subsequently processed conducting means on the insulator layer of the first substrate of the first conducting means; and
   second means for conducting a second charge carrier type in a second substrate of a second material having a second thermal budget directly coupled to the electrically isolating means on the first substrate, in which the first conducting means and the second conducting means cooperate to form a complementary device.

6. The semiconductor device of claim 5, in which the second substrate is on the first substrate and the first conducting means of the first substrate is electrically coupled to the second conducting means of the second substrate using an interconnect through the insulator layer.

7. The semiconductor device of claim 5, in which the first substrate is a silicon substrate and the second substrate is a III-V substrate.

8. The semiconductor device of claim 5, in which the first thermal budget is greater than 1000 degrees centigrade and the second thermal budget is less than 700 degrees centigrade.

9. The semiconductor device of claim 5, integrated into a mobile phone, a set top box, a music player, a video player, an entertainment unit, a navigation device, a computer, a hand-held personal communication systems (PCS) unit, a portable data unit, and/or a fixed location data unit.

* * * * *